United States Patent
Lee et al.

(10) Patent No.: US 8,154,003 B2
(45) Date of Patent: Apr. 10, 2012

(54) RESISTIVE NON-VOLATILE MEMORY DEVICE

(75) Inventors: Tzyh-Cheang Lee, Hsinchu (TW);
Fu-Liang Yang, Hsin-Chu (TW);
Tseung-Yuen Tseng, Hsin-Chu (TW);
Chih-Yang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 385 days.

(21) Appl. No.: 11/836,593

(22) Filed: Aug. 9, 2007

(65) Prior Publication Data
US 2009/0039332 A1    Feb. 12, 2009

(51) Int. Cl.
*H01L 45/00* (2006.01)
(52) U.S. Cl. .................. 257/4; 257/E45.003
(58) Field of Classification Search ............ 257/2, 4
See application file for complete search history.

(56) References Cited

U.S. PATENT DOCUMENTS

| 7,015,494 | B2 * | 3/2006 | Campbell | 257/4 |
| 7,420,198 | B2 * | 9/2008 | Baek et al. | 257/2 |
| 2005/0247921 | A1 * | 11/2005 | Lee et al. | 257/2 |
| 2006/0098472 | A1 * | 5/2006 | Ahn et al. | 365/145 |
| 2006/0203541 | A1 * | 9/2006 | Toda | 365/163 |
| 2006/0263289 | A1 * | 11/2006 | Heo et al. | 423/447.3 |
| 2007/0120580 | A1 * | 5/2007 | Kim et al. | 326/93 |
| 2007/0295950 | A1 * | 12/2007 | Cho et al. | 257/4 |

OTHER PUBLICATIONS

Baek et al.; "Multi-layer Cross-point Binary Oxide Resistive Memory (OxRRAM) for Post-NAND Storage Application", IEEE, 2005.

Kim et al.; Improvement of Resistive Memory Switching in NiO Using IrO2, Applied Physics Letters 88, 232106, 2006.

* cited by examiner

*Primary Examiner* — Benjamin Sandvik
(74) *Attorney, Agent, or Firm* — Haynes and Boone, LLP (57) ABSTRACT

The present disclosure provides a memory cell. The memory cell includes a first electrode, a variable resistive material layer coupled to the first electrode, a metal oxide layer coupled the variable resistive material layer; and a second electrode coupled to the metal oxide layer. In an embodiment, the metal oxide layer provides a constant resistance.

14 Claims, 10 Drawing Sheets

RESISTIVE NON-VOLATILE MEMORY DEVICE

BACKGROUND

The present disclosure relates generally to the field of nonvolatile memory devices, and more specifically to a resistive random access memory device (RRAM).

RRAM is an advantageous form of non-volatile memory in that it has a low operating voltage, high-speed characteristics, and good endurance. A memory cell element (also referred to as a memory element) of an RRAM device functions by determining a change in electrical resistance of a film, typically a metal oxide film, the resistance corresponding to the stored information (e.g. a value of "0" or "1"). An RRAM device typically includes an array of such memory cells, however, for convenience a single memory cell will be discussed herein. In particular, a memory cell of the RRAM device includes a data storage element that has two electrodes and a variable resistive material layer interposed between the two electrodes. The variable resistive material layer (also known as the data storage layer, memory thin film, or resistive thin film) has a reversible variation in resistance according to the polarity and/or the magnitude of an electric signal (e.g. voltage or current) applied between the electrodes. The variable resistive material layer is typically formed of transition metal oxide.

When a voltage is applied to the lower and/or upper electrode, a current may flow through the variable resistive material layer. The current does not flow uniformly, but follows a random path based upon crystalline state of the layer. The variation of the resistance produced for a particular applied voltage is of concern. The variation may cause performance issues for the RRAM device including decreased reliability and increased power consumption. This variation of resistance has been improved by processes such as using a plug contact for the bottom electrode. Improvements were also shown by inserting a buffer layer between the electrodes and the resistive material layer. However, these improvements have disadvantages including, for example, requiring additional process steps for the fabrication of a memory cell. Additional process steps may also be required in the fabrication of conventional RRAM in order to fabricate circuitry to limit the on/off current, as the conventional RRAM devices may not be self-limiting.

As such, an improved memory cell for RRAM device and method of fabricating the same is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to non-volatile memory and in particular to RRAM devices. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a feature on, connected to, coupled to, another feature in the description that follows may include embodiments in which the features are formed in direct contact, and may also include embodiments in which additional features may be formed interposing the features, such that the features may not be in direct contact. In contrast, if a feature is referred to as being "directly on" or "directly coupled," then there are no intervening features present. In addition, spatially relative terms, for example, "upper," "lower," "above," "below," etc, are used for ease of description of one features relationship to another feature. The spatially relative terms are intended to cover different orientations of the device including the features.

Figure 1:
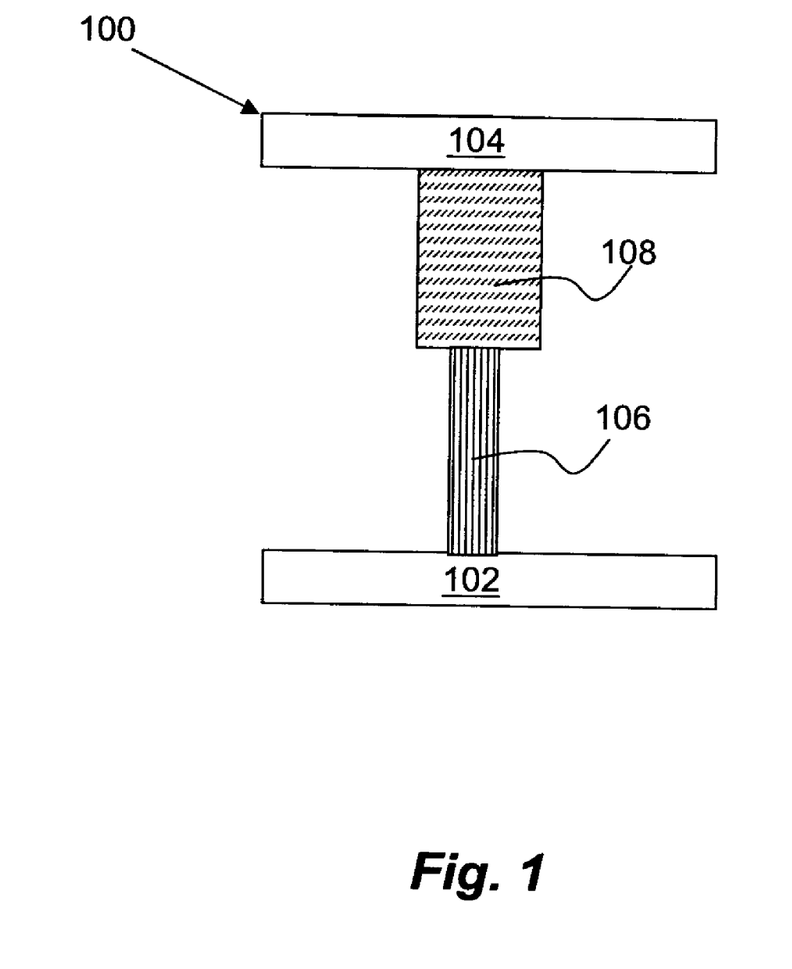
FIG. 1 is a diagram illustrating an embodiment of a data storage element.

Referring to FIG. 1, illustrated is a data storage element 100. The data storage element 100 includes a lower electrode 102, an upper electrode 104, a variable resistance portion (R-var) 106 and a constant resistance portion (R-constant) 108. The R-constant 108 provides a constant resistance (e.g. independent of the electrical signal supplied). The R-constant 108 allows the data storage element 100 to have self-limited current (Ion and Ioff). This may reduce and/or eliminate the need for extra circuitry outside of the data storage element in order to limit the Ion/Ioff current. The data storage element 100 may also provide for reduced resistance variation. The data storage element 100 may be included in a memory cell. An array including a plurality of memory cells may comprise a memory device.

Figure 3A:
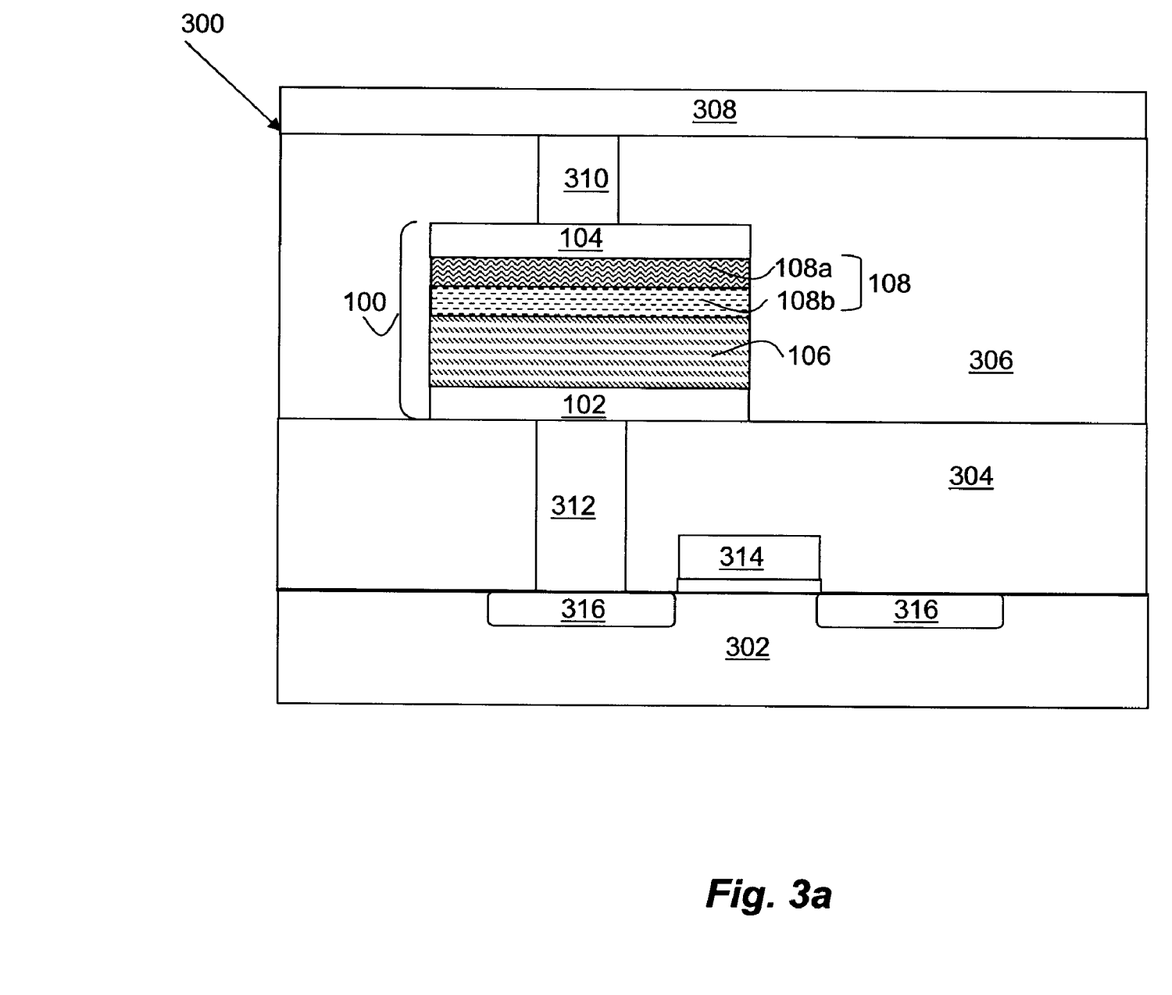
FIG. 3a is a cross-sectional view illustrating an embodiment of a memory cell.

The data storage element 100 functions to store data (such as a "0" or "1"). The resistance of R-var 106 determines the information stored by the data storage element 100. The R-var 106 includes a material layer (or a plurality of layers) characterized to show reversible resistance variance in accordance with a polarity and/or an amplitude of an applied electrical signal. In other words, the R-var 106 has a switchable state (e.g. a high resistance and a low resistance state). In a high resistance state, R-var 106 functions as an insulator; in a low resistance state, R-var 106 functions a conductor. The voltage required to convert R-var 106 to insulator (high resistance state) is referred to as a reset voltage. The voltage required to convert R-var 106 to conductor (low resistance state) is referred to as a set voltage. The electrical signal required to switch the state may be applied through the upper electrode 104 and/or the lower electrode 102. The data storage element 100 is described in greater detail below with reference to FIG. 3.

Figure 2:
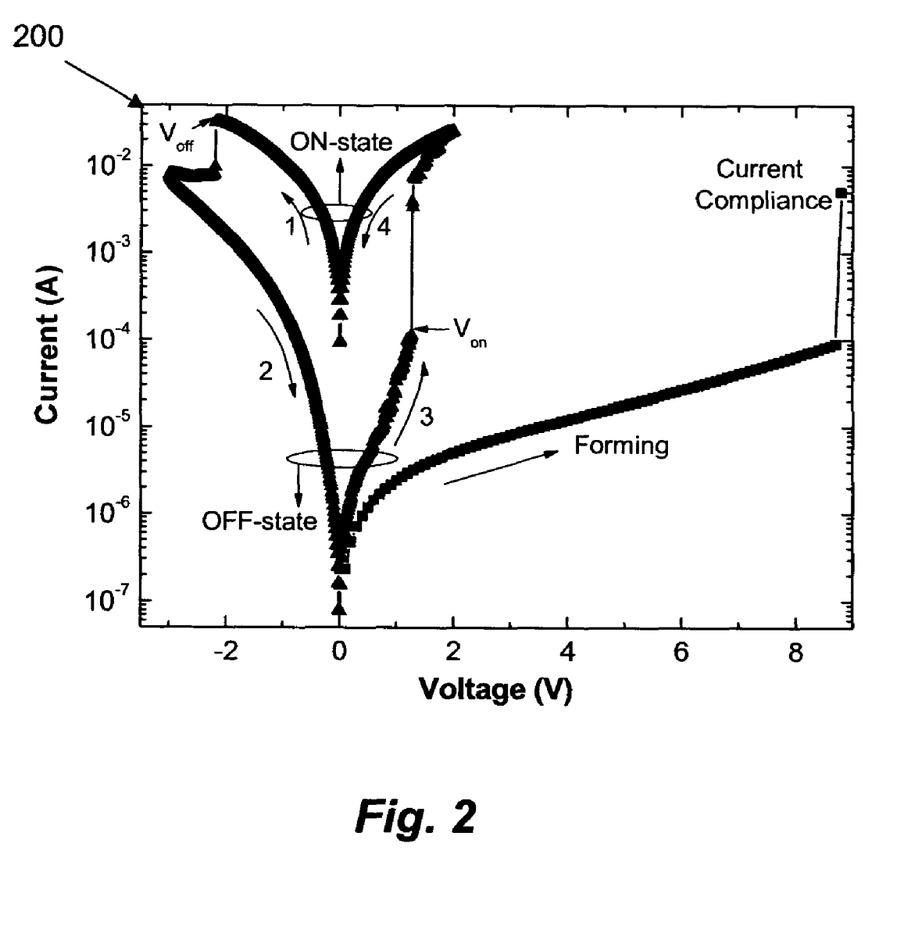
FIG. 2 is a graph illustrating an embodiment of the operating characteristic of a data storage element.

Referring now to FIG. 2, illustrated is a graph 200 of the operating characteristics of a data storage element, provided as current versus applied voltage (e.g. IV curve). The y-axis includes the current (in amperes) flowing through a variable resistance portion of a data storage element. The x-axis includes the voltage (in volts) applied to the data storage element (e.g. to the lower electrode and/or the upper electrode). The graph 200 may include the operating characteristics of the data storage element 100, described above with reference to FIG. 1. For example, the graph 200 may include the current flowing through R-var 106 versus the voltage applied to lower electrode 102 and/or the upper electrode 104. The graph 200 illustrates an "ON-state" where the data storage element includes a low resistance (e.g. resistance of R-var 106 is low) and an "OFF-state" where the data storage element includes a high resistance (e.g. the resistance of R-var 106 is high). Also illustrated is a voltage Von (e.g. set voltage) that produces a low resistance state and the voltage Voff (e.g. reset voltage) that produces a high resistance state in the data storage element.

Referring now to FIG. 3, illustrated is a memory cell 300. The memory cell 300 includes a data storage element 100 formed on a substrate 302. The data storage element 100 is coupled to a bit line 308 by a plug contact 310, however other methods of interconnect are possible. The data storage element 100 is coupled to the semiconductor substrate 302 by a plug contact 312, however again other methods and/or types of interconnect are possible. The plug contact 310 and 312 include conductive material, for example, tungsten (W). Insulating layers 304 and 306 are formed on the substrate 302. The insulating layers 304 and/or 306 may include silicon oxide, silicon nitride, and/or other insulating material known in the art. In an embodiment, the substrate 302 is silicon in a crystalline structure. In alternative embodiments, the substrate 302 may include other elementary semiconductors such as germanium, or includes a compound semiconductor such as, silicon carbide, gallium arsenide, indium arsenide, and/or indium phosphide. The substrate 302 may further include isolation structures (not shown) to define active regions and/or isolate one or more memory cells.

In the illustrated embodiment, a transistor is formed on the substrate 302 including a gate 314 and source/drain regions 316. The data storage element 100 is electrically coupled to one of the source/drain regions 316. The gate 314 and source/drain regions 316 may form an access transistor. The access transistor may control the access to the data storage element 100 during read/write operations. The source/drain regions 316 may be formed using conventional doping processes such as ion implantation. The gate 314 may include a gate dielectric and a gate electrode. The gate dielectric layer may include a dielectric material such as, silicon oxide, silicon nitride, silicon oxinitride, dielectric with a high dielectric constant (high k), and/or combinations thereof and may be formed using conventional processes. The gate electrode may include a conductive material, such as polysilicon or a metal and may also be formed using conventional processes. The depiction of memory cell 300 in FIG. 3a including a single transistor coupled to the data storage element 100 is illustrative only; various other embodiments of a memory cell that includes the data storage element 100 are possible. Other features may be present in the memory cell 300, for example, capping layers, buffer layers, additional transistors, and/or other features known in the art.

The data storage element 100 includes a lower electrode 102, an upper electrode 104, a variable resistance portion that includes a variable resistive material layer 106, and a constant resistance portion 108 that includes layers 108a and 108b. The lower electrode 102 includes a conductive material. In an embodiment, the lower electrode 102 includes platinum (Pt). Examples of other materials suitable for the lower electrode 102 include Al, Au, Ru, Ir, Ti, a metal oxide or nitride such as, IrO, TiN, TiAlN, RuO, polysilicon, and/or other conductive materials known in the art. The lower electrode 102 may include one or more oxidation resistant layers.

The variable resistive material layer 106 is a layer having a resistance conversion characteristic (e.g. variable resistance). In other words, the variable resistive material layer 106 includes material characterized to show reversible resistance variance in accordance with a polarity and/or an amplitude of an applied electrical pulse. The variable resistive material layer 106 includes a dielectric layer. The variable resistive material layer 106 may be changed into a conductor or an insulator based on polarity and/or magnitude of electrical signal. The variable resistive layer 106 may include a transition metal oxide. The transition metal oxide maybe denoted as MxOy where M is a transition metal, O is oxygen, x is the transition metal composition, and y is the oxygen composition. In an embodiment, the variable resistive material layer 106 includes $ZrO_2$. Examples of other materials suitable for the variable resistive material layer include NiO, $TiO_2$, HfO, ZrO, ZnO, $WO_3$, CoO, $Nb_2O_5$, $Fe_2O_3$, CuO, $CrO_2$, and/or other materials known in the art. In an embodiment, the variable resistive material layer 106 includes multiple layers having characteristics of a resistance conversion material. The set voltage and/or the reset voltage may be determined by variable resistive material layer 106 compositions (including the values of "x" and "y"), thickness, and/or other factors known in the art.

As illustrated in FIG. 3a, the constant resistance portion 108 of the data storage element 100 includes two metal oxide layers 108a and 108b. The metal oxide layers 108a and/or 108b provide a constant resistance in series with the variable resistance provided by the variable resistive material layer 106. Coupled to the constant resistance portion 108 is the upper electrode 104. The upper electrode 104 includes a conductive material. The upper electrode 104 may include a conductive material that is sensitive to oxidation (e.g. it is easily oxidized, non-oxidation resistant, oxygen sensitive, and/or oxygen-gettering). In an embodiment, the upper electrode 104 includes titanium (Ti). Other examples of suitable materials include Ta, Zn, Ag, Cu, Mo, and/or other conductive materials known in the art. The upper electrode 104 may be formed initially directly coupled to the variable resistive material layer 106. The formation of a metal of the upper electrode 104 in contact with the metal oxide of the variable resistive material layer 106 may cause the self-forming of the intermediate metal oxide layers 108a and/or 108b. The metal oxide layer 108a may be formed by the oxidation of a metal included in the upper electrode 104. The metal oxide layer 108b may be formed by the further reduction of the variable resistive material layer 106. Thus, the metal oxide layer 108a and/or the metal oxide layer 108b are self-forming in that they are formed by a self-oxidation process associated with the oxidation of the upper electrode 104 and/or the variable resistive material layer 106 on account of the interaction of the upper electrode 104 and the variable resistive material layer 106. As such, the metal oxide layer 108a may include an oxide of a type of metal included in the upper electrode 104. The metal oxide layer 108b may include an oxide of a type of metal included in the variable resistive material layer 106.

The metal oxide layer 108b composition differs from the composition of the variable resistive material layer (e.g. MxOy and MxOz wherein M illustrates the same type of metal and y and z illustrate different oxygen compositions). The diffusion of oxygen in the metal oxide layer 108b may be easier than the diffusion of oxygen in the variable resistive material layer 106.

In an embodiment, the data storage element 100 includes a stacked structure including the lower electrode 102 including Pt, a variable resistive material layer 106 including $ZrO_2$, and the upper electrode 104 including Ti. Due to the reaction of Ti and $ZrO_2$, the intermediate layers metal oxide layers 108a and 108b are formed. In the embodiment, the metal oxide layer 108a includes TiOx, wherein x is a composition of oxide in the metal oxide. In the embodiment, the metal oxide layer 108b includes ZrOy, where y is the composition of oxide in the metal oxide. The composition of oxygen "y" may not be equal two (2).

Figure 3B:
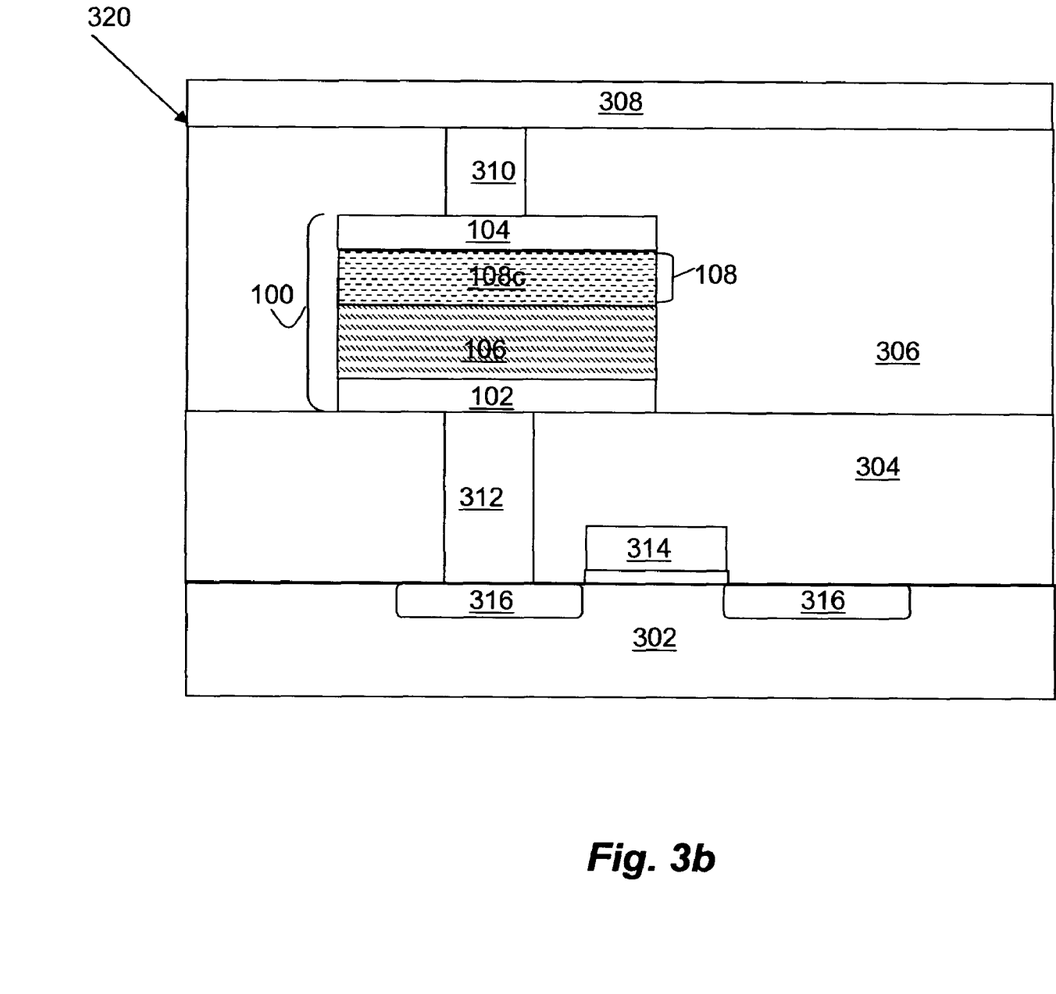
FIG. 3b is a cross-sectional view illustrating an alternative embodiment of a memory cell.

Referring now to FIG. 3b, illustrated is a magnetic element 320. The magnetic element 320 is substantially similar to the magnetic element 300, described above with reference to FIG. 3a, except as to variations to the magnetic element 100 described herein. In the embodiment, the constant resistance portion 108 of the data storage element 100 includes a layer 108c that serves as a constant resistance. The layer 108c provides a constant resistance in series with the variable resistance of the variable resistive material layer 106. The layer 108c may include a metal oxide. The metal oxide may include oxides of, for example, Ti, Ta, Zn, Ag, Cu, Mo, and/or other metals known in the art. The metal oxide layer 108c may be deposited on the substrate 302 and in particular on the variable resistive material layer 106. Coupled the layer 108c is the upper electrode 104. The upper electrode 104 includes a conductive material. The upper electrode 104 of the magnetic element 320 may include an oxidation resistant metal layer. Examples of conductive materials that may be included in the upper electrode 104 include Ir, Pt, IrO, TiN, TiAlN, Ru, RuO, polysilicon, and/or other conductive materials known in the art. In the embodiment, the layer 108c may be formed including a metal that is not found in the variable resistive material layer 106 or the top electrode 104.

Figure 4:
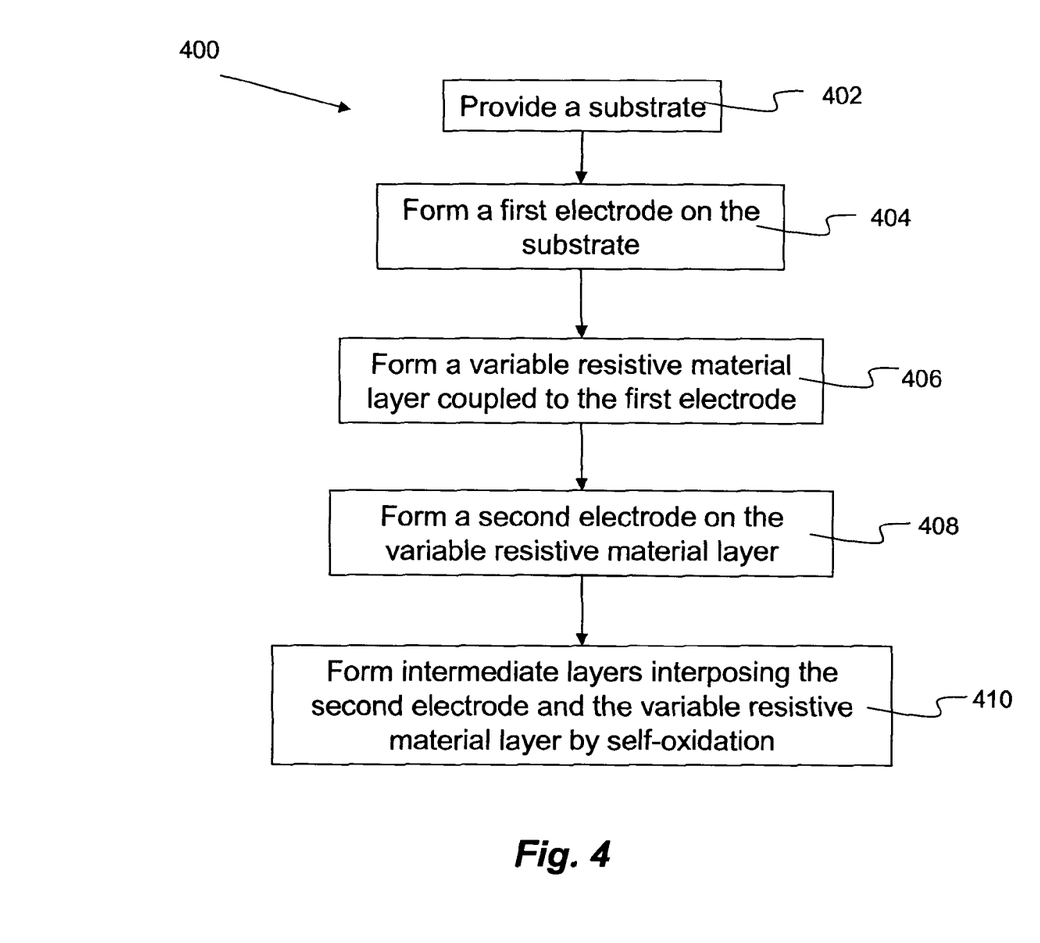
FIG. 4 is a flow chart illustrating an embodiment of a method of fabricating a data storage element.
Figure 5:
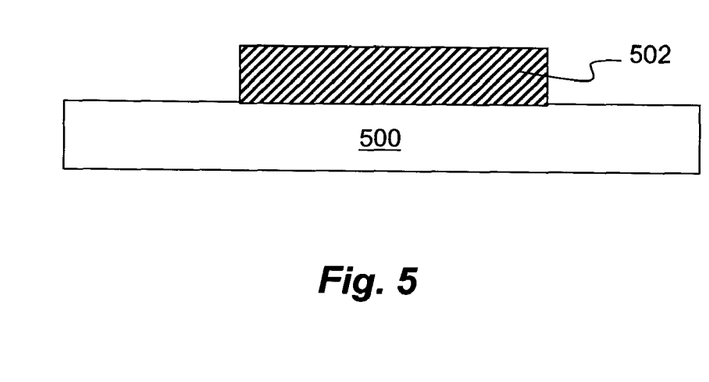
FIGS. 5, 6, 7, and 8 are cross-sectional views illustrating a method of fabricating a data storage element according to an embodiment of the method of FIG. 4.
Figure 6:
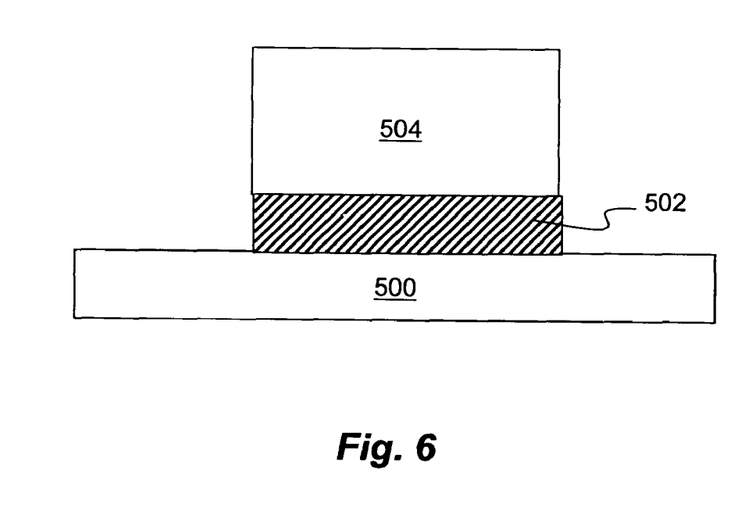
Figure 7:
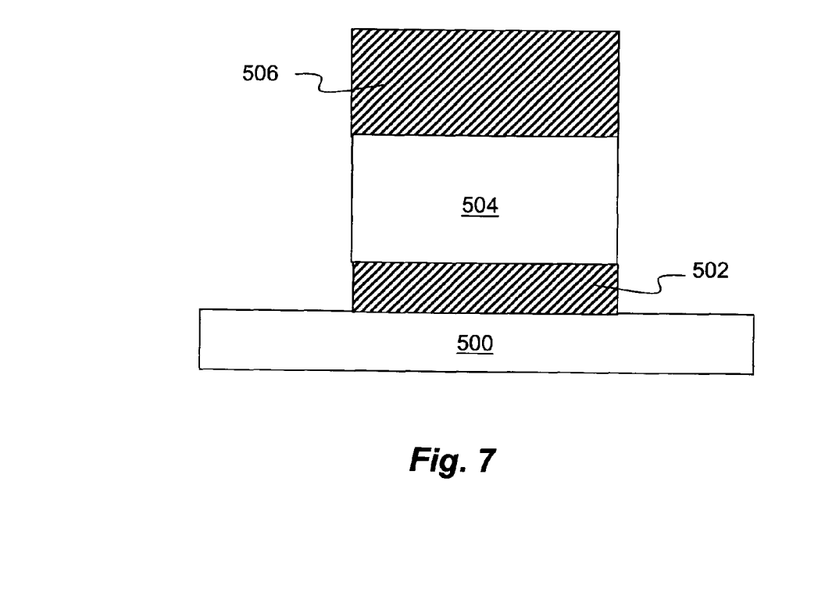

Referring now to FIG. 4, illustrated is a method 400 of fabricating a data storage element such as data storage element 100, described above with reference to FIG. 3a. FIGS. 5, 6, 7, and 8 illustrate incremental modifications of a substrate 500 that correspond to the steps of FIG. 4.

The method 400 begins at step 402 where a substrate is provided. The substrate may be substantially similar to the substrate 302, described above with reference to FIGS. 1 and 3a. The substrate may include isolation regions, transistors, interconnect structures, insulating layers, and/or other features known in the art. The method 400 proceeds to step 404 where a first electrode is formed on the substrate. The first electrode may be substantially similar to the lower electrode 102, described above in reference to FIGS. 1 and 3a. The first electrode may be formed by conventional processes including chemical vapor deposition (CVD), physical vapor deposition (PVD), atomic layer deposition (ALD), plating, and/or other processes known in the art. Referring to the example of FIG. 5, a substrate 500 is provided with a first electrode 502 formed on the substrate.

The method 400 proceeds to step 406 where a variable resistive material layer is formed on the substrate. In particular, the layer is formed coupled to the first electrode. The variable resistive material layer may be substantially similar to the variable resistive material layer 106, described above with reference to FIGS. 1 and 3a. The variable resistive material layer may include metal oxide. In an embodiment, the variable resistive material layer includes $ZrO_2$. Examples of other materials suitable for the variable resistive material layer include NiO, $TiO_2$, HfO, ZrO, ZnO, $WO_3$, CoO, $Nb_2O_5$, $Fe_2O_3$, CuO, $CrO_2$ and/or other materials known in the art. The variable resistive material layer may be formed using conventional processes such as physical vapor deposition (PVD) (sputtering) a layer of metal on the substrate and oxidizing the metal. The metal may be oxidized for example using an $O_2$ plasma process, a thermal oxidation, and/or other processes known in the art. Other methods of forming the variable resistive material layer include $O_2$ reactive sputtering, CVD, ALD, and/or other processes known in the art. Referring to the example of FIG. 6, the variable resistive material layer 504 is formed on the substrate 500 and in particular coupled to the first electrode 502.

The method 400 proceeds to step 408 where a second electrode is formed. The second electrode may be substantially similar to the upper electrode 104, described above with reference to FIGS. 1 and 3a. The second electrode may be formed by conventional processes such as chemical vapor deposition (CVD), physical vapor deposition (PVD), atomic layer deposition (ALD), plating, and/or other processes known in the art. The upper electrode includes a conductive material that is easily oxidized, oxygen-gettering, and/or oxygen-sensitive material. The second electrode is formed on the variable resistive material layer, described above with reference to step 406. Referring to the example of FIG. 7, an electrode 506 is formed on the substrate 500. The electrode 506 is formed directly on the variable resistive material layer 504.

The method 400 proceeds to step 408 where one or more intermediate layers are formed interposing the second electrode and the variable resistive material layer. One or more of the intermediate layers formed may provide a constant resistance. The intermediate layers may be substantially similar to the metal oxide layers 108a and 108b described above with reference to FIGS. 1 and 3a. The intermediate layers are self-forming in that they form from the interaction of the second electrode and the variable resistive material layer. The intermediate layers may be formed by a self-oxidizing process.

The second electrode includes an easily oxidized material. As such, a portion of the originally formed second electrode (described above with reference to step 406) may be oxidized. This oxidation may be associated with oxygen present in the variable resistive material layer (e.g. metal oxide). Thus, a first intermediate layer is formed from the oxidation of the second electrode. The first intermediate layer includes a metal oxide. (It should be noted that "first" and "second" are used to distinguish the intermediate layers for descriptive only and not to necessitate the manner of their formation.) The first intermediate layer may be substantially similar to the metal oxide layer 108a, described above with reference to FIG. 3a. As the first intermediate layer is formed from the oxidation of the second electrode, it includes an oxidized form of one or more metals included in the second electrode. For example, in an embodiment, the second electrode includes Ti. The Ti oxidizes to form a first intermediate layer including TiOx.

A second intermediate layer is formed interposing the second electrode and the variable resistive material. The second intermediate layer is also self-forming in that it forms by a self-oxidizing process. The layer forms from the further reduction of the variable resistive material layer. The further reduction of the variable resistive material layer may be associated with the variable resistive material layer's interaction with the second electrode. This interaction may be associated with the second electrode's oxygen-gettering composition and the variable resistive material layer including a metal oxide. This second intermediate layer may be substantially similar to the metal oxide layer 108b, described above with reference to FIG. 3a. The second intermediate layer includes a metal oxide including the same type of metal as the variable resistive material layer, but including a different oxygen composition than the variable resistive material layer. For example, the second intermediate layer may include a composition of MxOz and the variable resistive material layer a composition of MxOy, where z and y denote the oxygen composition and are different values. In an embodiment, the variable resistive material layer includes $ZrO_2$ and the second intermediate layer includes ZrOz, where z is not equal to two (2).

Figure 8:
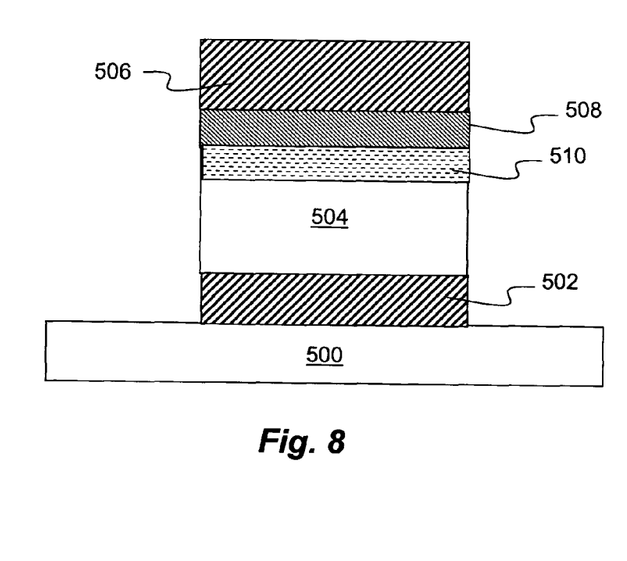

Referring to the example of FIG. 8, a first intermediate layer 508 and a second intermediate layer 510 are formed on the substrate 500. The first intermediate layer 508 and the second intermediate layer 510 interpose the variable resistive material layer 504 and the second electrode 506. The intermediate layers 508 and 510 are self-aligned. The first intermediate layer 508 includes a metal oxide of a metal included in the second electrode 506. In an embodiment, the second electrode 506 includes Ti, and the first intermediate layer 508 includes TiOx. The second intermediate layer 510 includes a metal oxide. The metal oxide of the second intermediate layer 510 may include the same metal as the variable resistive material layer 504, but with has a different oxygen composition. In an embodiment, the variable resistive material layer 504 is $ZrO_2$ and the second intermediate layer 510 is ZrOz where z is not equal to two (2).

Thus, a data storage element comprising the first electrode 502, the variable resistance material layer 504, the constant resistance material layer 508, the constant resistance material layer 510, and the second electrode 506 is formed on the substrate 500. The data storage element may be substantially similar to the data storage element 100 described above with reference to FIGS. 1, and/or 3a. The method 400 may continue to include steps such as depositing insulating material, forming interconnect structures, forming bit lines, and/or other processes known in the art.

Figure 9:
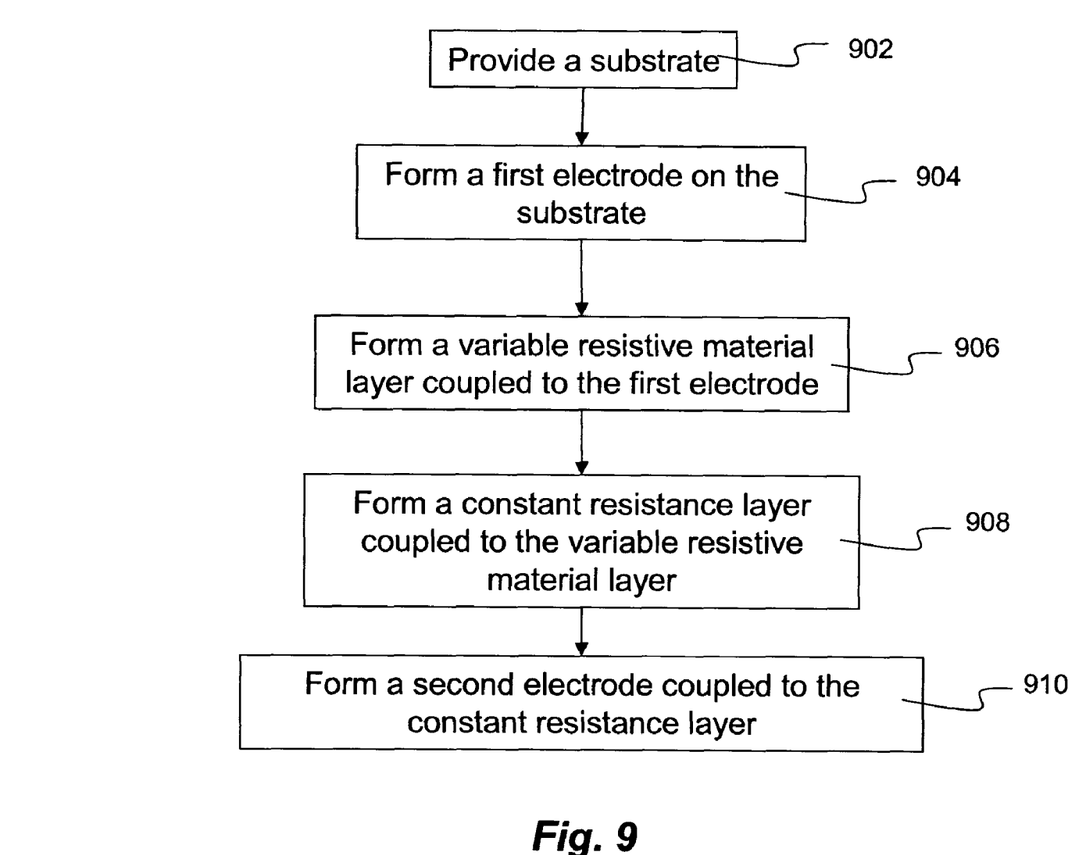
FIG. 9 is a flow chart illustrating an embodiment of a method of fabricating a data storage element.
Figure 10:
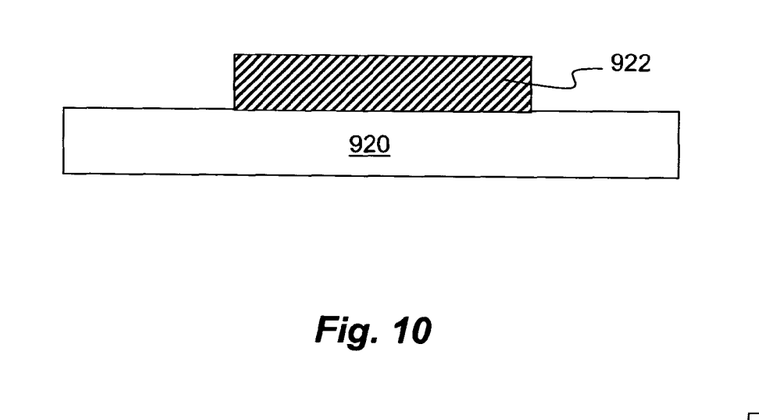
FIGS. 10, 11, 12, and 13 are cross-sectional views illustrating a method of fabricating a data storage element according to an embodiment of the method of FIG. 9.
Figure 11:
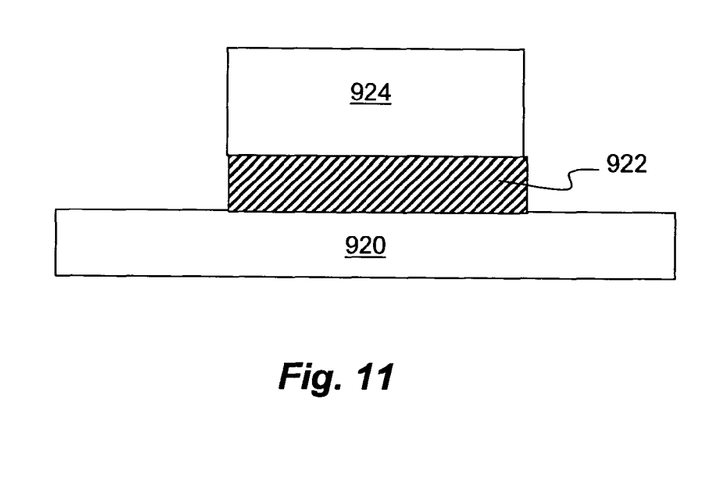
Figure 12:
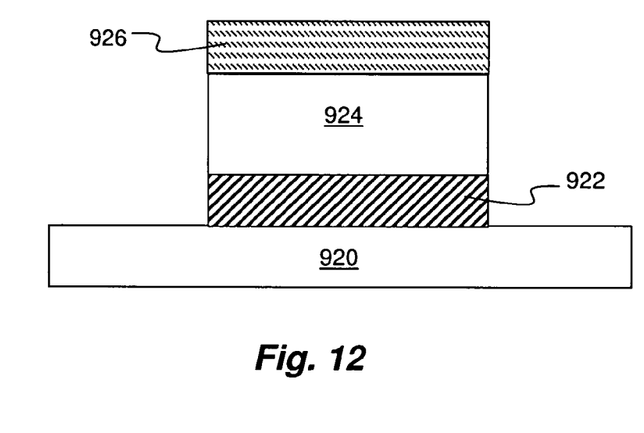
Figure 13:
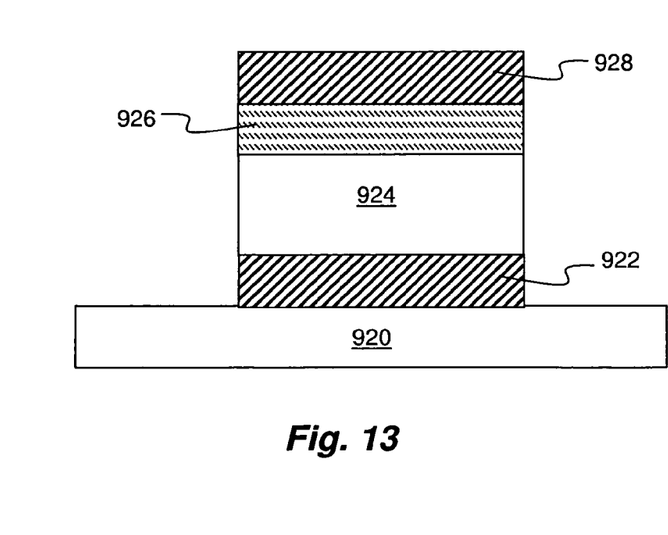

Referring now to FIG. 9, illustrated is a method 900 of fabricating a data storage element such as data storage element 100, described above with reference to FIGS. 3a and 3b. FIGS. 10, 11, 12, and 13 illustrate incremental modifications of a substrate 920 that correspond to the steps of FIG. 9.

The method 900 begins at step 902 where a substrate is provided. The substrate may include a substrate substantially similar to the substrate 302, described above with reference to FIG. 3a. The substrate may also include isolation regions, transistors, interconnect structures, insulating layers, and/or other features known in the art. The method 900 proceeds to step 904 where a first electrode is formed on the substrate. The first electrode may be substantially similar to the lower electrode 102, described above in reference to FIGS. 1, 3a, and 3b. The first electrode may be formed by conventional processes including chemical vapor deposition (CVD), physical vapor deposition (PVD), atomic layer deposition (ALD), plating, and/or other deposition processes known in the art. Referring to the example of FIG. 10, a substrate 920 is provided with a first electrode 922 formed on the substrate.

The method 900 proceeds to step 906 where a variable resistive material layer is formed on the substrate, and in particular coupled to the first electrode. The variable resistive material layer may be substantially similar to the variable resistive material layer 106, described above with reference to FIGS. 1 and 3a. The variable resistive material layer may include metal oxide. In an embodiment, the variable resistive material layer includes $ZrO_2$. Examples of other materials suitable for the variable resistive material layer include NiO, $TiO_2$, HfO, ZrO, ZnO, $WO_3$, CoO, $Nb_2O_5$, $Fe_2O_3$, CuO, $CrO_2$ and/or other materials known in the art. The variable resistive material layer may be formed using conventional processes. In an embodiment, the layer is formed by physical vapor deposition (PVD) (sputtering) of metal on the substrate and oxidizing the metal. The metal may be oxidized for example, by an $O_2$ plasma process, a thermal oxidation, and/or other processes known in the art. Other methods of forming the variable resistive material layer include $O_2$ reactive sputtering, CVD, ALD, and/or other processes known in the art. Referring to the example of FIG. 11, the variable resistive material layer 924 is formed on the first electrode 922.

The method 900 proceeds to step 908 where a constant resistance layer is formed. The constant resistance layer may be single layer of material or a plurality of layers that serve as a constant resistance in series with the variable resistance material layer formed above with reference to step 906. The constant resistance layer may be substantially similar to the layer 108c, described above with reference to FIG. 3b. The constant resistance layer includes a metal oxide. The metal oxide may include oxides of, for example, Ti, Ta, Zn, Ag, Cu, Mo, and/or other metals known in the art. The layer may be formed using conventional deposition processes. In an embodiment, the layer is formed by physical vapor deposition (PVD) (sputtering) a layer of metal on the substrate and oxidizing the formed metal layer. The metal may be oxidized for example using an $O_2$ plasma process, a thermal oxidation, and/or other processes known in the art. Referring to the example of FIG. 12, a constant resistance layer 926 is formed on the substrate 920. The constant resistance layer 926 is formed directly coupled to the variable resistive material layer 924, though other embodiments are possible.

The method 900 proceeds to step 910 where a second electrode is formed. The second electrode may be substantially similar to the upper electrode 104, described above with reference to FIGS. 1 and 3b. The second electrode may include a conductive material resistant to oxidation. Examples of conductive materials that may be included in the second electrode include Ir, Pt, IrO, TiN, TiAlN, Ru, RuO, polysilicon, and/or other conductive materials known in the art. The second electrode may be formed by conventional processes such as chemical vapor deposition (CVD), physical vapor deposition (PVD), atomic layer deposition (ALD), plating, and/or other processes known in the art. Referring to the example of FIG. 13, an electrode 928 is formed on the substrate 920. The electrode 928 is formed directly on the constant resistance layer 926, though other embodiments are possible.

Thus, a data storage element comprising the first electrode 922, the variable resistance material layer 924, the constant resistance material layer 926, and the second electrode 928 is formed on the substrate 920. The data storage element may be substantially similar to the data storage element 100 described above with reference to FIGS. 1, 2, and/or 3b. The method 900 may continue to include steps such as depositing insulating material including to isolate the data storage element, forming interconnect structures, forming bit lines, and/or other processes known in the art.

Although only a few exemplary embodiments of this invention have been described in detail above, those skilled in the art will readily appreciate that many modifications are possible in the exemplary embodiments without material departing from the novel teachings and advantages of this disclosure.

Thus, the present disclosure provides a memory cell. The memory cell includes a first electrode, a variable resistive material layer coupled to the first electrode, a metal oxide layer coupled the variable resistive material layer; and a second electrode coupled to the metal oxide layer. In an embodiment, the metal oxide layer provides a constant resistance.

Also provided is an integrated circuit including a data storage element, the data storage element. The data storage element includes a first electrode, a first metal oxide layer coupled to the first electrode, a second metal oxide layer coupled to the first metal oxide layer, and a second electrode, coupled to the second metal oxide layer. The first metal oxide layer provides a variable resistance and the second metal oxide layer provides a constant resistance.

Also provided is a method of forming a resistive memory cell. The method includes providing a substrate. A bottom electrode is formed on the substrate. A variable resistive material layer is formed on the formed bottom electrode. A top electrode is formed on the variable resistive material layer. A first metal oxide layer is formed interposing the top electrode and the variable resistive material layer.

Also provided is a method of programming a memory cell. The method includes providing a data storage element. The data storage element includes a first electrode, a first metal oxide layer coupled to the first electrode, a second metal oxide layer coupled to the first metal oxide layer, and a second electrode, coupled to the second metal oxide layer. A first voltage is supplied to the data storage element. The first voltage provides for a first resistance in the first metal oxide layer and a second resistance in the second metal oxide layer. A second voltage is supplied to the data storage element. The second voltage provides for a first resistance in the first metal oxide layer and the third resistance in the second metal oxide layer. The third resistance is greater than the second resistance. The third resistance may correspond to storing one value and a low resistance may correspond to storing a different value.

What is claimed is:

1. A memory cell for use in an integrated circuit device, the memory cell comprising:
    a first electrode;
    a variable resistive material layer coupled to the first electrode;
    a first metal oxide layer coupled the variable resistive material layer;
    a second metal oxide layer formed on the first metal oxide layer, wherein the first metal oxide layer includes an interface with the variable resistive material layer, wherein the first metal oxide layer and the second metal oxide layer together form a constant resistance layer, the constant resistance layer providing the resistance of a current flowing from the first electrode is approximately equivalent to the resistance of a current flowing towards the first electrode; and
    a second electrode on the second metal oxide layer, wherein the second electrode includes an interface with the second metal oxide layer, wherein the second electrode includes a first metal, and wherein the second metal oxide layer includes an oxidized form of the first metal.

2. The memory cell of claim 1, wherein the second electrode includes an oxygen sensitive metal.

3. The memory cell of claim 1, wherein the first metal is titanium (Ti).

4. The memory cell of claim 1, wherein the first metal oxide layer includes a first composition, and the variable resistive material layer includes a second composition, wherein the first composition and the second composition include a same type of metal and differing oxygen compositions.

5. The memory cell of claim 4, wherein the first composition includes a lower oxygen composition than the second composition.

6. The memory cell of claim 1, wherein the diffusion of oxygen is easier in the first metal oxide layer than the variable resistive material layer.

7. The memory cell of claim 1, wherein the first metal oxide layer includes a self-formed layer.

8. A memory cell for use in an integrated circuit device, the memory cell comprising:
    a first electrode;
    a variable resistive material layer coupled to the first electrode, wherein the variable resistive material layer includes a first metal type and a first oxygen composition;
    a first metal oxide layer coupled to the variable resistive material layer, wherein the first metal oxide includes a second metal type and a second oxygen composition;
    a second metal oxide layer, wherein the second metal oxide layer interposes the first metal oxide layer and the variable resistive material layer, wherein the second metal layer includes the first metal type and a third oxygen composition different than the first oxygen composition, wherein the first metal oxide layer and the second metal oxide layer provide a constant resistance between the variable resistive material layer and a second electrode, and wherein the resistance of a current flowing from the second electrode is approximately equivalent to the resistance of a current flowing towards the second electrode; and
    the second electrode coupled to the first metal oxide layer and including the second metal type.

9. The memory cell of claim 8, wherein the second metal type is a metal from the group consisting of Ti, Ta, Zn, Ag, Cu, Mo, Zr, and combinations thereof.

10. The memory cell of claim 8, wherein the first metal oxide layer includes a self-formed layer.

11. The memory cell of claim 8, wherein the second metal oxide layer having the third oxygen composition is a reduction of the variable resistive material layer.

12. The memory cell of claim 8, wherein the second metal is a metal selected from the group consisting of Ti, Ta, Zn, Ag, Cu, Mo, and combinations thereof.

13. The memory cell of claim 8, wherein the second electrode comprises titanium, the variable resistive material comprises a zirconium oxide and the first metal oxide layer comprises a zirconium oxide, and the second metal oxide layer comprises a titanium oxide.

14. An integrated circuit including a data storage element, the data storage element comprising:
    a first electrode,
    a first metal oxide layer coupled to the first electrode, wherein the first metal oxide includes a first composition including a first type of metal and a first oxygen composition,
    a second metal oxide layer coupled to the first metal oxide layer, wherein the second metal oxide layer includes a second composition including the first type of metal and second oxygen composition, wherein the second oxygen composition is different than the first oxygen composition, and
    a third metal oxide layer coupled to the second metal oxide layer;
    a second electrode, coupled to the third metal oxide layer, wherein the third metal oxide layer includes a third composition and the second electrode includes a fourth composition, wherein the third and fourth compositions include a same type of metal and differing oxygen compositions; and wherein the first metal oxide layer provides a variable resistance and the second metal oxide layer and the third metal oxide layer provide a constant resistance, wherein the constant resistance provides that a resistance of a current flowing from the first electrode is approximately equivalent to a resistance of a current flowing towards the first electrode.

* * * * *